US008179679B2

(12) United States Patent
Slagle

(10) Patent No.: US 8,179,679 B2
(45) Date of Patent: May 15, 2012

(54) AIRFLOW GUIDES USING SILICON WALLS/CREATING CHANNELS FOR HEAT CONTROL

(75) Inventor: Richard A. Slagle, Newark, CA (US)

(73) Assignee: NetApp, Inc., Sunnyvale, CA (US)

( * ) Notice: Subject to any disclaimer, the term of this patent is extended or adjusted under 35 U.S.C. 154(b) by 0 days.

(21) Appl. No.: 11/412,380

(22) Filed: Apr. 27, 2006

(65) Prior Publication Data

US 2007/0253170 A1 Nov. 1, 2007

(51) Int. Cl.
*H05K 7/20* (2006.01)

(52) U.S. Cl. ........ 361/720; 361/690; 361/713; 174/260; 257/717; 257/725

(58) Field of Classification Search ............. 361/694, 361/695, 717–721, 16, 818, 816, 719, 748, 361/783, 795, 688–690, 704, 707, 710, 722; 165/80.3; 174/50, 252, 526, 250, 251; 454/184
See application file for complete search history.

(56) References Cited

U.S. PATENT DOCUMENTS

| | | | | |
|---|---|---|---|---|
| 4,969,066 A * | 11/1990 | Eibl et al. | ...................... | 361/785 |
| 6,031,723 A * | 2/2000 | Wieloch | ...................... | 361/719 |
| 6,101,094 A * | 8/2000 | Kermaani et al. | ............. | 361/720 |
| 6,442,024 B1 * | 8/2002 | Shih | ............................. | 361/695 |
| 6,504,718 B2 * | 1/2003 | Wu | ................................ | 361/695 |
| 7,120,018 B2 * | 10/2006 | Shen et al. | ..................... | 361/695 |
| 7,187,559 B2 * | 3/2007 | Hirabayashi et al. | ......... | 361/780 |
| 7,402,897 B2 * | 7/2008 | Leedy | ............................ | 257/678 |
| 2003/0189830 A1 * | 10/2003 | Sugimoto et al. | ............. | 362/294 |
| 2004/0066617 A1 * | 4/2004 | Hirabayashi et al. | ......... | 361/683 |
| 2005/0036288 A1 * | 2/2005 | Shen et al. | ..................... | 361/695 |
| 2007/0235168 A1 * | 10/2007 | Chen et al. | ..................... | 165/124 |
| 2008/0041562 A1 * | 2/2008 | Bhatia | ........................ | 165/80.3 |

* cited by examiner

*Primary Examiner* — Courtney Smith
(74) *Attorney, Agent, or Firm* — Suiter Swantz pc llo

(57) ABSTRACT

An electronic device includes a printed circuit board having a wall deposited directly on a board serving as a base for a printed circuit. As the board is constructed, the wall is deposited on the board for controlling airflow. The wall controls airflow across the board and around components mounted to the board. The wall may be utilized for controlling airflow in combination with a second printed circuit board positioned adjacent to the first printed circuit board. The wall may be utilized for controlling various types of airflow, including airflow from sources including fans and convection, and from geometries including horizontal and vertical mounting geometries. The silicon wall may be utilized for preventing heat airflow generated by heat radiated from one component from impinging upon another component.

25 Claims, 5 Drawing Sheets

AIRFLOW GUIDES USING SILICON WALLS/CREATING CHANNELS FOR HEAT CONTROL

FIELD OF THE INVENTION

The present invention generally relates to the field of electronic devices employing printed circuit boards, and more particularly to a printed circuit board for an electronic device including a wall deposited directly on the board for controlling airflow across the board and its components.

BACKGROUND OF THE INVENTION

Printed circuit boards comprise thin boards of insulating material (e.g., fiberglass impregnated with epoxy resin, paper impregnated with phenolic resin, plastic, polyimide film, silicon, and materials including copper or aluminum cores) that serve as the base for a printed circuit, i.e., a pattern of connections, or traces, superimposed (printed) onto a non-conductive substrate. The connections are metal strips (e.g., copper), and the pattern is typically produced using silk screen printing, photoengraving, PCB Milling, and/or electroplating. Electronic components are fixed to the board and connected to the printed circuit with solder. Component leads and integrated circuit pins may pass through holes (vias) in the board, or, alternatively, they may be surface mounted. Printed circuit boards may include components mounted on one or both sides, as well as internal signal layers, which allow more connections within the same board area. For example, most printed circuit boards are composed of conductive layers separated and supported by layers of insulating material (substrates) laminated (glued) together. Printed circuit boards, including those for high frequency circuits, may include one or more power and ground planes, e.g., large areas of copper for greater current carrying ability.

Printed circuit boards often include one or more components which require cooling. One technique for cooling such components is to control the airflow across the printed circuit board and its components (e.g., directing or pulling across cooler air towards heat generating components). However, printed circuit boards are usually designed for integration within a larger system, such as a Personal Computer (PC) tower, or the like. In such systems, the placement and orientation of the printed circuit board is often fixed in advance. This may be problematic. For instance, when a printed circuit board is vertically oriented, a heat generating component mounted at the bottom of the board may heat up devices directly above it. Moreover, the placement of other components external to the printed circuit board, including system fans for directing airflow over the board, are often fixed as well. Additionally, a heat generating component may be placed in close proximity to other components on a printed circuit board.

Existing techniques to control airflow across a printed circuit board include utilizing paper, plastic, or sheet metal walls which are preformed and then placed around components on the board. These walls direct, control, or prevent airflow across the printed circuit board as needed. However, utilizing such preformed walls increases the complexity of printed circuit boards. Further, walls formed separately from their corresponding printed circuit board must be matched up with each board and then affixed thereto, creating additional manufacturing steps.

Consequently, it would be desirable to provide a printed circuit board including a wall deposited directly on the board for controlling airflow across the board and its components.

SUMMARY OF THE INVENTION

The present invention is directed to an electronic device including a printed circuit board having a wall deposited directly on a board serving as a base for a printed circuit. As the board is constructed, the wall is deposited on the board for controlling airflow, e.g., a silicon wall is directly painted (formed) on the board. The silicon wall controls airflow across the board and around components mounted to the board. For example, in one embodiment, the silicon wall may be painted between a first component and a second component for preventing airflow directed toward the second component from impinging upon the first component. In other embodiments, the silicon wall may be painted over a first component. The silicon wall may be utilized for controlling airflow around a portion of the printed circuit, such as power planes, ground planes, conductive strips, and the like.

In embodiments of the invention, the silicon wall is deposited to form a wall having a characteristic height. Thus, the silicon wall may be used for controlling airflow in combination with a second printed circuit board positioned adjacent to the first printed circuit board. Additionally, the silicon wall may control various types of airflow, including airflow from sources including fans and convection, and from geometries including horizontal and vertical mounting geometries. The silicon wall may also be utilized for preventing airflow generated by heat radiated from the second component from impinging upon the first component. This may be desirable when a system fan, or a like device, is not included with the electronic device.

It is to be understood that both the foregoing general description and the following detailed description are exemplary and explanatory only and are not necessarily restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Figure 1:
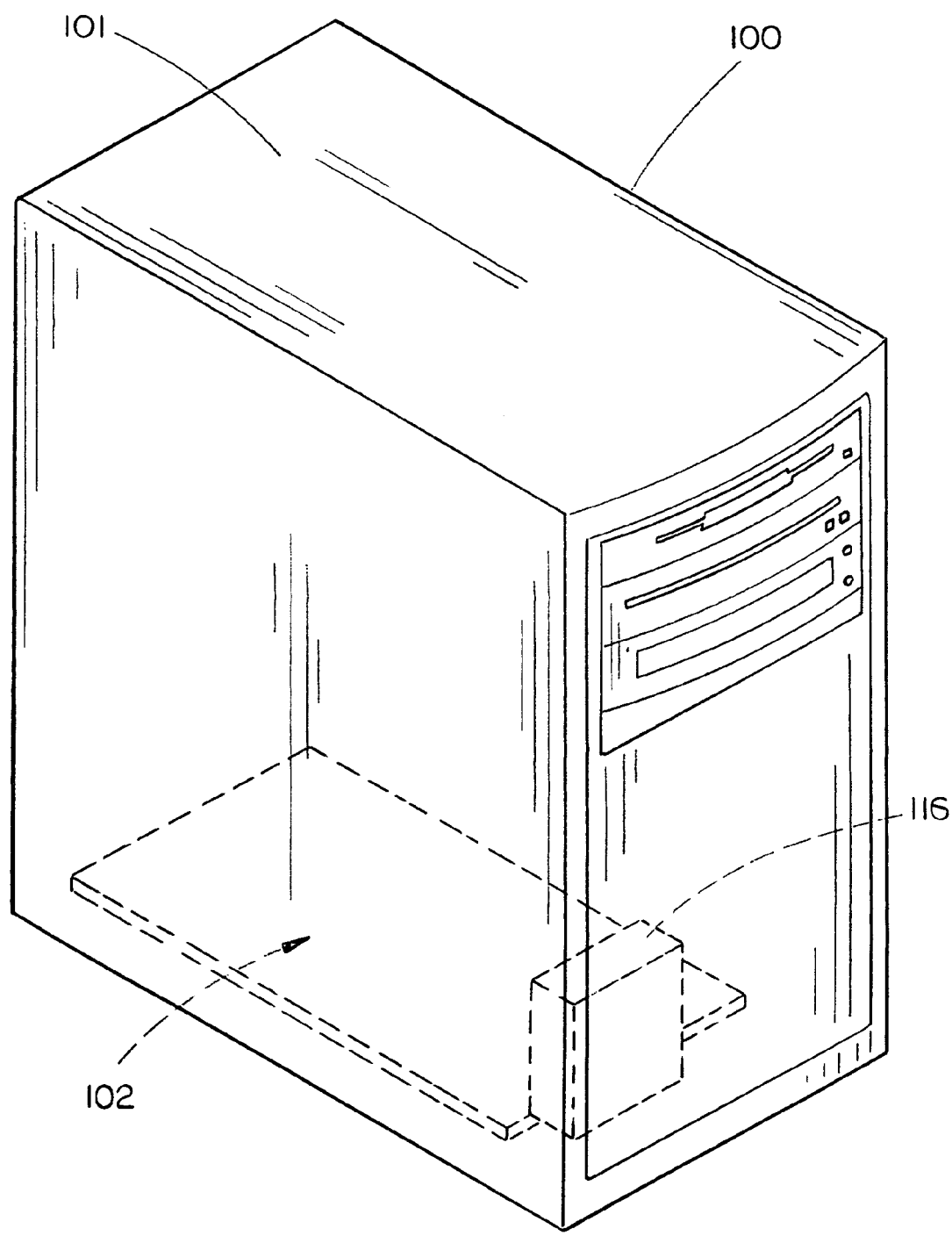
FIG. 1 is an isometric view illustrating an electronic device including a printed circuit board in accordance with an exemplary embodiment of the present invention.
Figure 2:
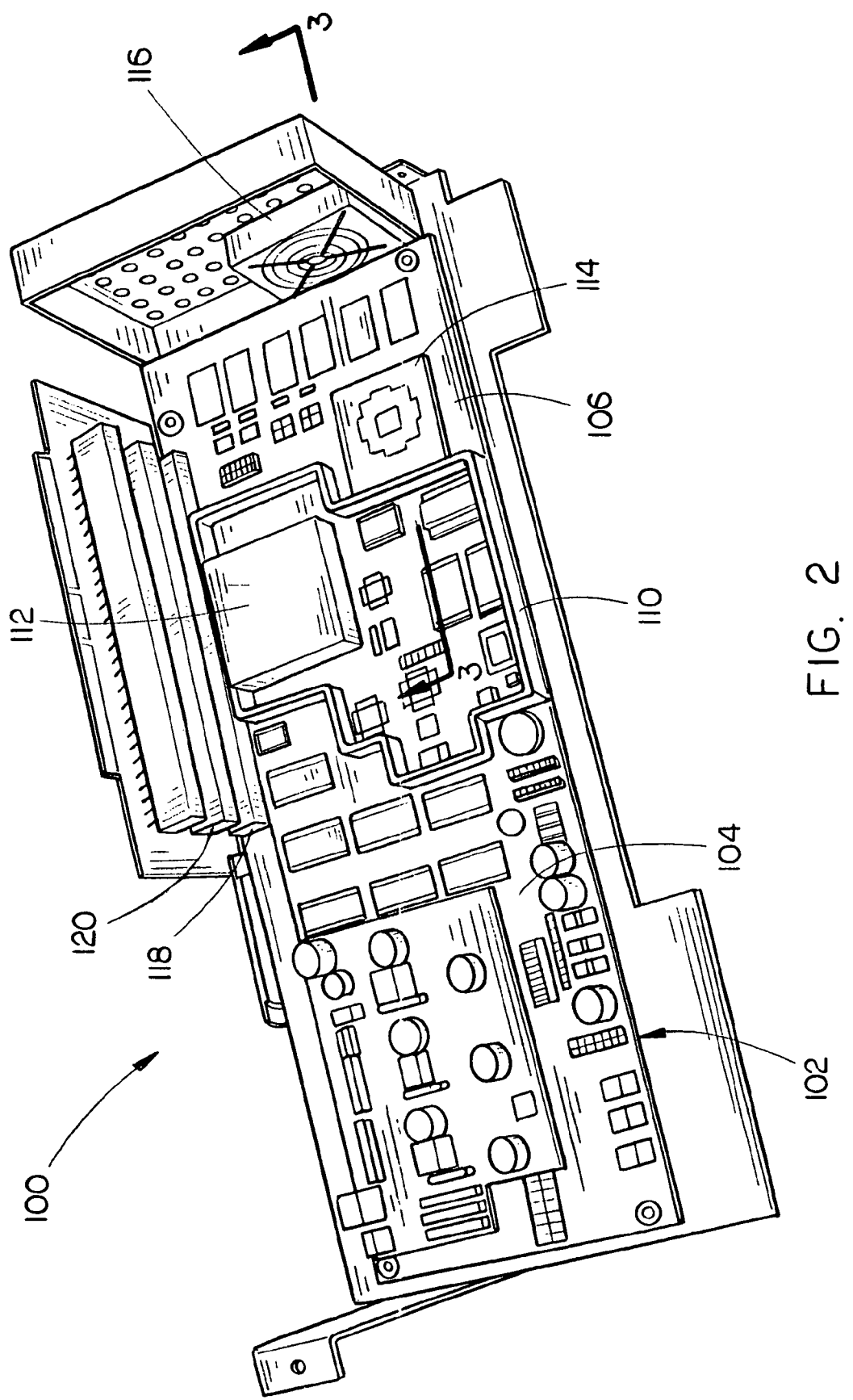
FIG. 2 is a partial isometric view of the electronic device illustrated in FIG. 1.
Figure 3:
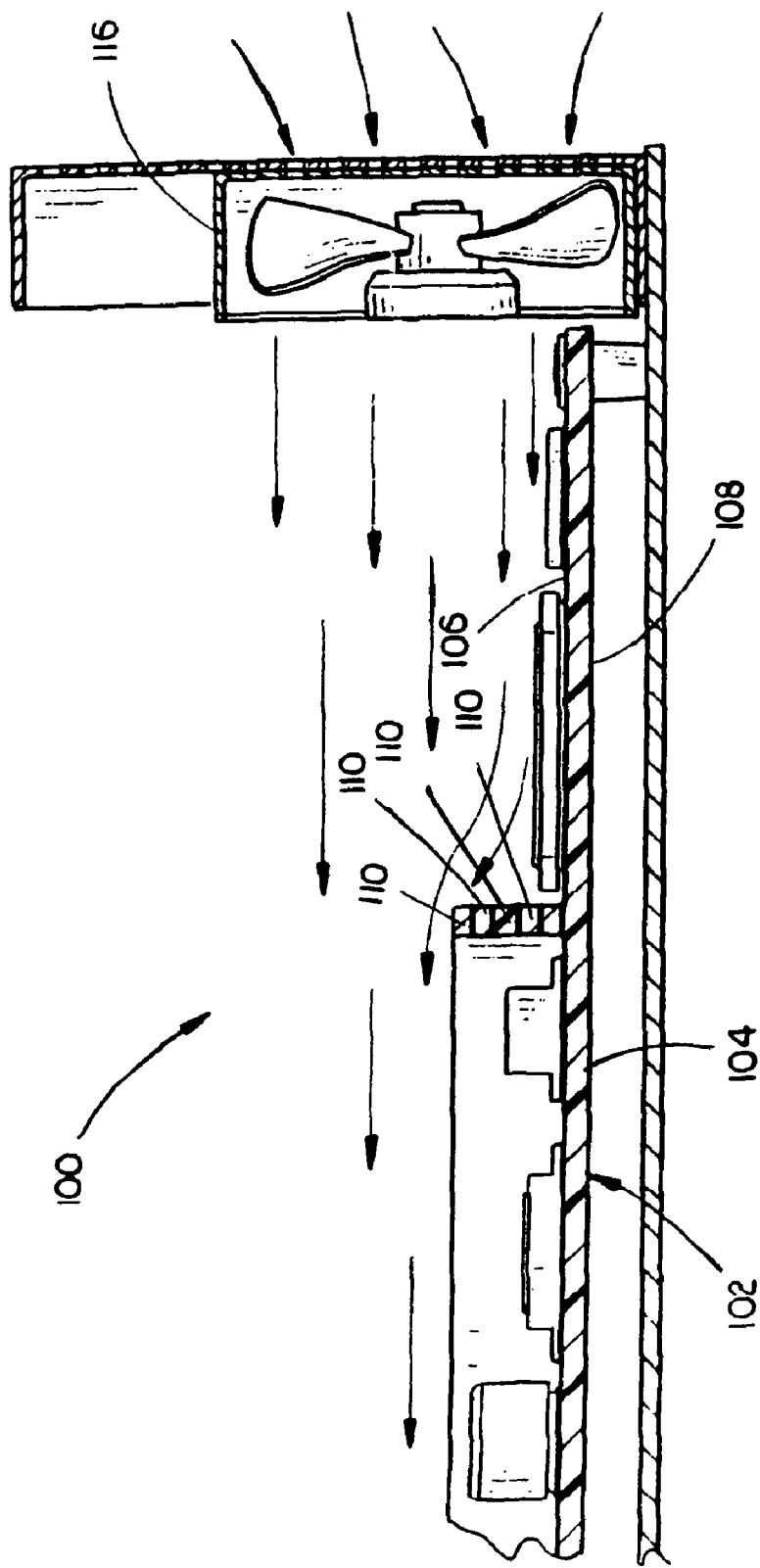
FIG. 3 is a partial cross-sectional side elevation view of the electronic device illustrated in FIG. 1.

Reference will now be made in detail to the presently preferred embodiments of the invention, examples of which are illustrated in the accompanying drawings.

Referring generally to FIGS. 1 through 5, an electronic device 100 including a housing or chassis 101 enclosing or containing a printed circuit board 102 is described in accordance with exemplary embodiments of the present invention. The housing 101 further includes a cooling system for providing airflow for cooling components within the electronic device 100. For example, in the embodiments shown in FIGS. 1 through 5, the cooling system may comprise one or more system fans 116 for creating a flow of air through the housing 101 thereby causing airflow across the printed circuit board 102 for cooling the printed circuit board 102 and components mounted thereto. Alternatively, in other embodiments, the cooling system may employ convective cooling techniques which do not employ a system fan.

The printed circuit board 102 includes a board 104 serving as a base for a printed circuit. The printed circuit may include a pattern of connections formed of electrically conductive material (e.g., metal strips) and printed on the board 104. In a specific embodiment, the connections forming the printed circuit are strips of copper printed on the board 104 using a photomask and chemical etching to remove unwanted copper from a layer of copper foil adhered to the board 104. Additionally, the board 104 may include power and ground planes, including large areas of electrically conductive material for greater current carrying ability. Preferably, the board 104 is formed of an insulating material, such as silicon, or the like.

In the embodiments illustrated, the printed circuit is printed on a first side 106 and/or a second side 108 of the board 104. Additionally, the printed circuit board 102 may include internal signal layers, which are printed between successive layers of insulating material (substrates) comprising the board 104. For instance, a first layer of silicon is deposited, and the printed circuit is printed on the first layer. Successive layers of silicon are deposited between the printed circuit as the board 104 is constructed and the substrates are glued together. It will be appreciated that various techniques may be utilized for constructing the board 104 and the printed circuit without departing from the scope and intent of the present invention.

As the board 104 is constructed, one or more walls for controlling airflow are deposited on the board 104, e.g., a silicon wall 110 is directly painted (formed) on the board 104 by depositing successive layers of insulating material. In a specific embodiment, the layers of insulating material are applied on the board 104 as a viscous liquid, paste, or gel. In another specific embodiment, the layers of insulating material may be sprayed onto the board as a liquid, or applied to the board as two or more separate component substances which harden when combined. Once applied, the insulating material may be cured or hardened using processes such as ultraviolet (UV) curing, room temperature vulcanizing (RTV), or the like. The silicon wall 110 controls airflow across the board 104 and around the components mounted to the board 104. For example, in one embodiment, a first component 112 (e.g., a microprocessor) and a second component 114 may be mounted on the first side 106 of the board 104. In the embodiment illustrated in FIGS. 2 and 3, the silicon wall 110 has been deposited onto the board 104 around the first component 112, at least partially forming an enclosure around the component. Moreover, the silicon wall 110 has been deposited between the first component 112 and the second component 114. In this configuration, the silicon wall 110 is utilized for preventing airflow directed toward the second component 114 from impinging upon the first component 112. This may be desirable to prevent the airflow heated by the second component 114 from heating and damaging the first component 112, especially when the location of a system fan 116 is fixed relative to the placement of the printed circuit board 102. In this manner, the silicon wall 110 guides the airflow from the cooling system (e.g., created by the system fan 116) for regulating temperature within the enclosure and/or within the housing 101 outside of the enclosure. Further, the enclosure may be utilized for preventing radiant heat from components outside of the enclosure from impinging upon components within the enclosure.

Figure 4:
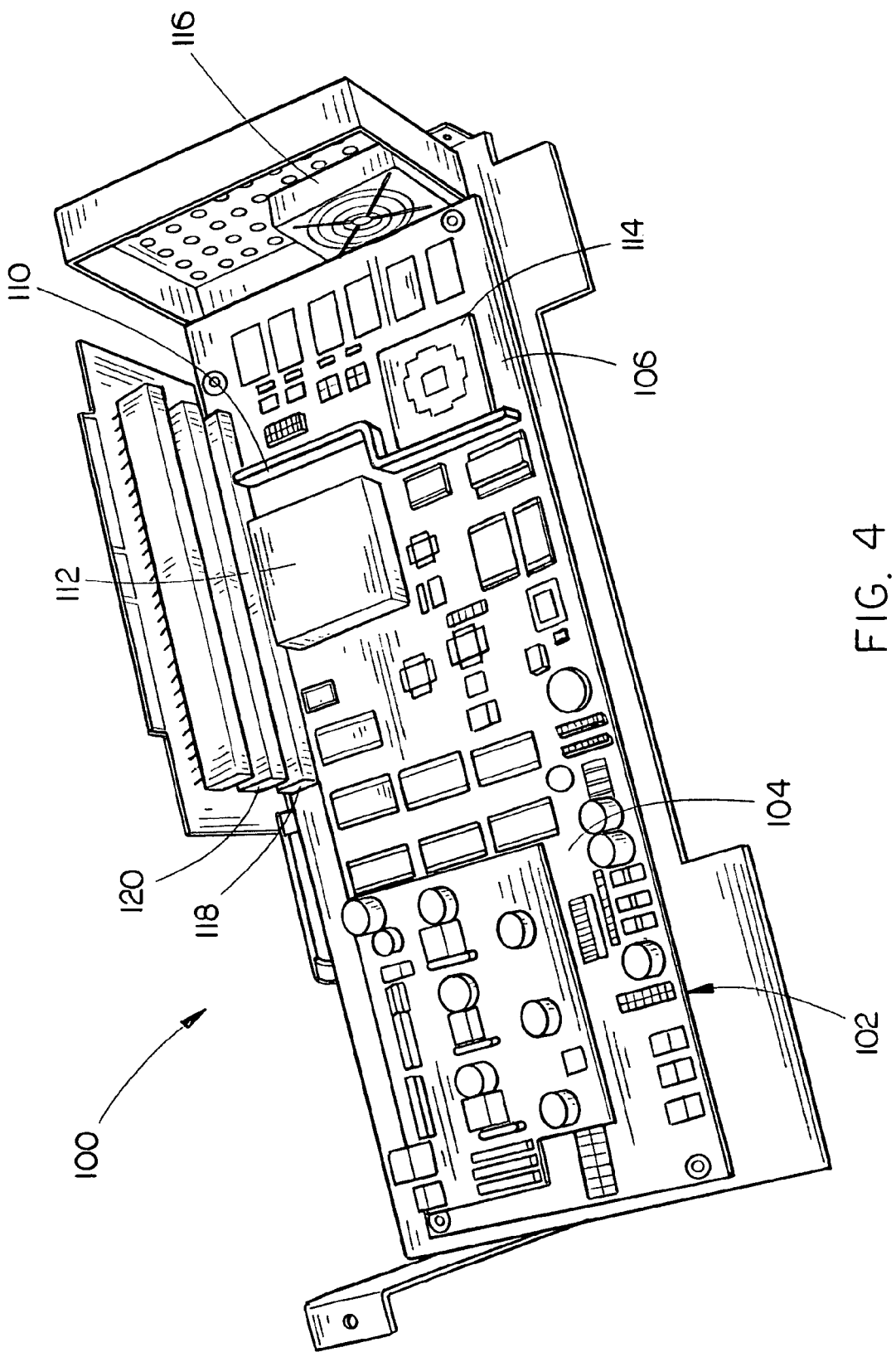
FIG. 4 is a partial isometric view illustrating an electronic device including a printed circuit board in accordance with an exemplary embodiment of the present invention.

In the embodiment illustrated in FIG. 4, the silicon wall 110 is painted between the first component 112 and the second component 114, but not painted around the first component 112. In still further embodiments, the silicon wall 110 extends over the first component 112 (e.g., the silicon wall 110 is painted over the first component 112). In this manner, the silicon wall 110 inhibits access to the first component 110, and may also inhibit access to underlying circuitry (i.e. portions of the printed circuit) positioned under the silicon wall 110. Such a configuration may be useful for providing security for a first component 112 comprising a security processor, or the like. It will be appreciated that the silicon wall 110 may be deposited on the board 104 around the first component 112 and the second component 114 in different ways without departing from the scope and intent of the present invention. For instance, the silicon wall 110 may be painted around both the first component 112 and the second component 114. Further, it should be noted that silicon walls 110 may be deposited on either or both of the first side 106 and the second side 108 of the board 104. In other embodiments, the silicon wall 110 is utilized for controlling airflow around a portion of the printed circuit, such as power planes, ground planes, conductive strips, and the like.

In embodiments of the invention, the printed circuit board 102 may include components mounted on one or both sides of the board 104 and connected to the printed circuit. For instance, an electronic component, such as the first component 112, the second component 114, or the like, is fixed to the first side 106 of the board 104 and connected to the printed circuit. In one specific embodiment, the first component 112 is connected to the printed circuit with solder. Accordingly, the first component 112 may include component leads and/or integrated circuit pins that pass through holes (vias) in the board 104 and are soldered to the printed circuit on the second side 108 of the board 104 (opposite to the first side 106 on which the first component 112 is mounted). Alternatively, the first component 106 may be surface mounted and soldered to the printed circuit on the first side 106 of the printed circuit board 102. It will be appreciated that electronic components may be fixed to the board 104 and connected to the printed circuit in a variety of ways without departing from the scope and intent of the present invention.

Figure 5:
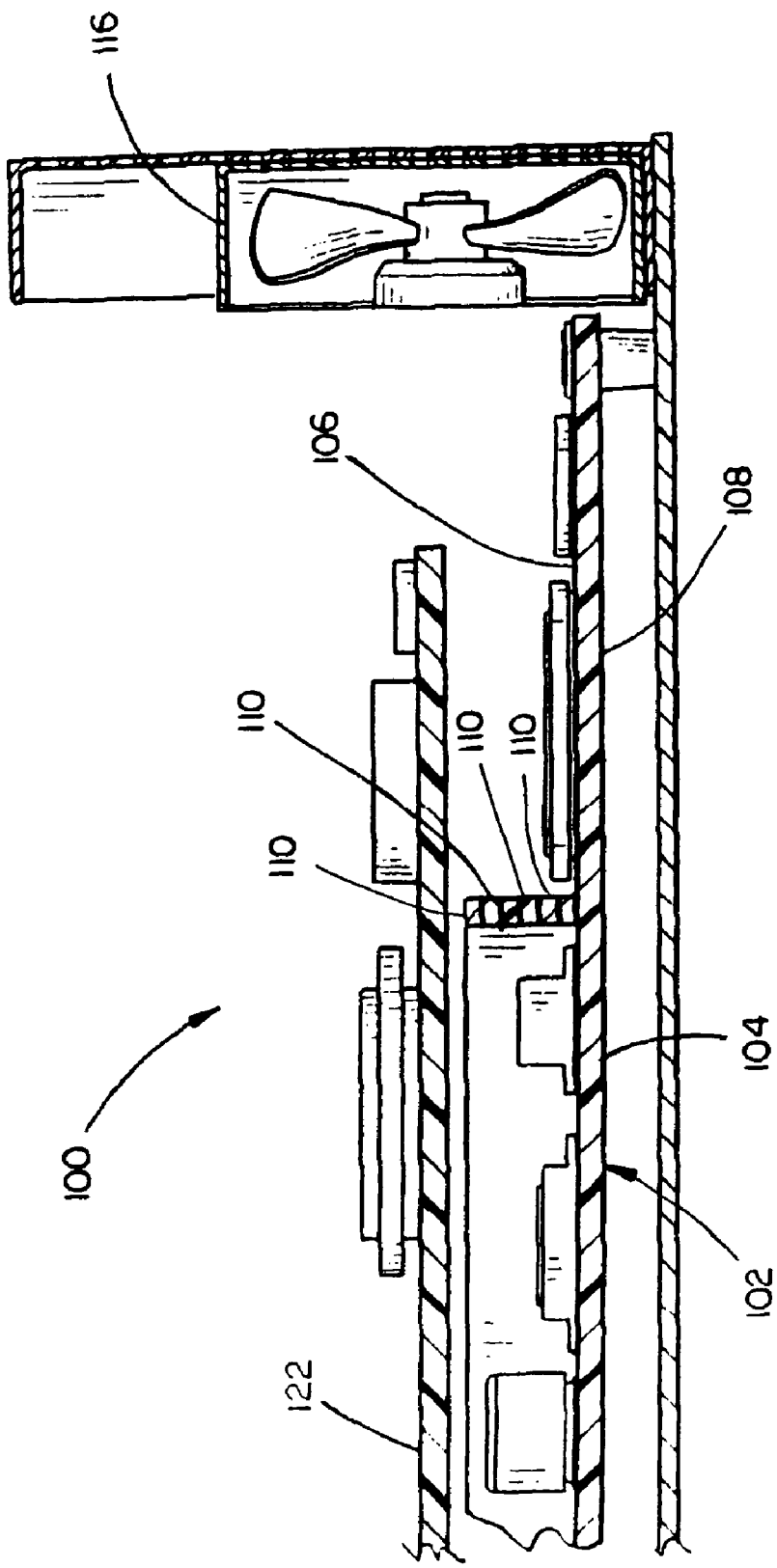
FIG. 5 is a partial cross-sectional side elevation view illustrating an electronic device including a first printed circuit board and a second printed circuit board in accordance with an exemplary embodiment of the present invention.

In the embodiment illustrated in FIG. 5, the silicon wall 110 is deposited to form a wall having a specific characteristic dimension, such as a specific height. The silicon wall 110 may be utilized for preventing airflow directed toward the second component 114 from impinging upon the first component 112 in combination with a second printed circuit board 122 positioned adjacent to the first printed circuit board 102. For example, the electronic device 100 includes one or more sockets, connectors, or the like, for additional printed circuit boards, such as slots 118 and 120. When the first printed circuit board 102 is inserted into slot 118 and the second printed circuit board 122 is inserted into slot 120 (adjacent to the silicon wall 110 and over the first component 112), the second printed circuit board 122 may be utilized in combination with the silicon wall 110 for preventing airflow directed toward the second component 114 from impinging upon the first component 112. In this manner, the silicon wall 110 may act in combination with the second printed circuit board 122 to partition the first component 112 from other heat generating components in the electronic device 100. Thus, the silicon wall 110 and the second printed circuit board 122 comprise an enclosure for regulating temperature around the first component 112. In another specific embodiment, the silicon wall 110 and the second printed circuit board 122 serve to inhibit access to the first component 112.

While airflow generated by the system fan 116 across the printed circuit board 102 is depicted as being generally horizontal in FIGS. 1 through 5, this exemplary airflow is not meant to be restrictive of the invention. Thus, it will be appreciated that airflow across the printed circuit board 102 may result from other factors and geometries as well, including vertical air circulation when the printed circuit board 102 is mounted vertically. For example, in a configuration in which the second component 114 is mounted below the first component 112, heat from the second component 114 (or, alternatively, from another heat source, e.g., a component mounted on another printed circuit board) may generate convective airflow directed generally upward toward the first component 112. In such a configuration, the silicon wall 110 may be utilized for preventing this airflow from impinging upon the first component 112. It should be noted that the silicon wall 110 may be utilized for controlling other types of airflow as well, including airflow generated from other sources besides fans and convection, and other geometries besides horizontal and vertical mounting geometries.

It should be noted that the silicon wall 110 may also be utilized for preventing airflow generated by heat radiated from the second component 114 from impinging upon the first component 112. This may be desirable when a system fan 116, or a like device, is not included with the electronic device 100.

It will be appreciated that while the board 104 and the silicon wall 110 have been described as being formed of silicon, the board 104 and the silicon wall 110 may be formed of other insulating materials, including fiberglass impregnated with epoxy resin, paper impregnated with phenolic resin, plastic, polyimide film, silicon, and materials including copper or aluminum cores, without departing from the scope and intent of the present invention.

It is believed that the present invention and many of its attendant advantages will be understood by the foregoing description, and it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A printed circuit board, comprising:
a board formed of first insulating material for serving as a base for a printed circuit superimposed on the board and for at least one component; and
a wall consisting of a plurality of successive second insulating material layers, a first layer of said plurality of successive second insulating material layers being a liquid which is configured to be cured on the board, the wall forming an extension of the board, wherein the wall controls airflow across the board and around the at least one component, where the airflow is generated by a system fan, substantially directed horizontally across the printed circuit board, and the airflow is directed toward another component to prevent airflow impinging upon the at least one component.

2. The printed circuit board as claimed in claim 1, wherein the component is fixed to the board and connected to the printed circuit with solder.

3. The printed circuit board as claimed in claim 2, wherein the wall extends over the component.

4. The printed circuit board as claimed in claim 2, wherein the wall is deposited around the component.

5. The printed circuit board as claimed in claim 2, further comprising another component fixed to the board.

6. The printed circuit board as claimed in claim 5, wherein the wall is deposited between the first component and another component.

7. An electronic device, comprising:
a printed circuit board including a board formed of first insulating material for serving as a base for a printed circuit superimposed on the board;
at least one component mounted to the printed circuit board; and
a wall consisting of a plurality of successive second insulating material layers, a first layer of said plurality of successive second insulating material layers being a liquid which is configured to be cured on the board, the wall forming an extension of the board, wherein the wall controls airflow across the board and around the at least one component, where the airflow is generated by a system fan, substantially directed horizontally across the printed circuit board, and the airflow is directed toward another component to prevent airflow impinging upon the at least one component.

8. The electronic device as claimed in claim 7, wherein the component is fixed to the board and connected to the printed circuit with solder.

9. The electronic device as claimed in claim 8, wherein the wall is deposited around the component.

10. The electronic device as claimed in claim 8, further comprising another component fixed to the board.

11. The electronic device as claimed in claim 10, wherein the wall is deposited between the first component and another component.

12. An electronic device, comprising:
a housing;
a printed circuit board contained within the housing, the printed circuit board including a board formed of first insulating material for serving as a base for a printed circuit superimposed on the board;
a component mounted to the printed circuit board;
a cooling system for providing airflow for cooling components within the electronic device; and
a wall consisting of a plurality of successive second insulating material layers, a first layer of said plurality of successive second insulating material layers being a liquid which is configured to be cured on the board for forming an enclosure extending at least partially around the component, the wall forming an extension of the board, wherein the wall guides the airflow for regulating temperature in at least one of the enclosure and the housing outside of the enclosure.

13. The electronic device as claimed in claim 12, wherein the component is fixed to the board and connected to the printed circuit with solder.

14. The electronic device as claimed in claim 13, wherein the wall extends over the component.

15. The electronic device as claimed in claim 13, wherein the wall is deposited around the component.

16. The electronic device as claimed in claim 12, further comprising a second printed circuit board including a second board formed of third insulating material positioned adjacent to the wall for forming a further portion of the enclosure.

17. An electronic device, comprising:
a printed circuit board including a board formed of first insulating material for serving as a base for a printed circuit superimposed on the board;
a component mounted to the printed circuit board; and
a wall consisting of a plurality of successive second insulating material layers, a first layer of said plurality of successive second insulating material layers being a liquid which is configured to be cured on the board for forming an enclosure around the component, the wall forming an extension of the board, wherein the wall inhibits access to at least one of the printed circuit and the component.

18. The electronic device as claimed in claim 17, wherein the component is fixed to the board and connected to the printed circuit with solder.

19. The electronic device as claimed in claim 18, wherein the wall extends over the component.

20. The electronic device as claimed in claim 18, wherein the wall is deposited around the component.

21. The electronic device as claimed in claim 17, further comprising a second printed circuit board including a second board formed of third insulating material positioned adjacent to the wall for forming a further portion of the enclosure.

22. The printed circuit board as claimed in claim 1, wherein at least one of the first insulating material or the second insulating material insulating material includes silicon.

23. The printed circuit board as claimed in claim 1, wherein at least one of the first insulating material or the second insulating material insulating material includes fiberglass impregnated with epoxy resin.

24. The printed circuit board as claimed in claim 1, wherein at least one of the first insulating material or the second insulating material insulating material includes plastic.

25. The printed circuit board in claim 1, wherein at least one of the first insulating material or the second insulating material insulating material includes paper impregnated with phenolic resin.

* * * * *